(12) United States Patent
Chen et al.

(10) Patent No.: US 9,640,441 B2
(45) Date of Patent: May 2, 2017

(54) VOIDS IN STI REGIONS FOR FORMING BULK FINFETS

(71) Applicant: Taiwan Semiconductor Manufacturing Company, Ltd., Hsin-Chu (TW)

(72) Inventors: Hung-Ming Chen, Zhubei (TW); Feng Yuan, Hsin-Chu (TW); Tsung-Lin Lee, Hsin-Chu (TW); Chih Chieh Yeh, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/201,047

(22) Filed: Jul. 1, 2016

(65) Prior Publication Data

US 2016/0315015 A1   Oct. 27, 2016

Related U.S. Application Data

(60) Continuation of application No. 14/826,977, filed on Aug. 14, 2015, now Pat. No. 9,385,046, which is a
(Continued)

(51) Int. Cl.
| | |
|---|---|
| *H01L 21/82* | (2006.01) |
| *H01L 21/8234* | (2006.01) |
| *H01L 27/088* | (2006.01) |
| *H01L 29/06* | (2006.01) |
| *H01L 21/311* | (2006.01) |

(Continued)

(52) U.S. Cl.
CPC ..... *H01L 21/823481* (2013.01); *H01L 21/31111* (2013.01); *H01L 21/31116* (2013.01); *H01L 21/764* (2013.01); *H01L 21/76224* (2013.01); *H01L 21/823431* (2013.01);
(Continued)

(58) Field of Classification Search
CPC ............ H01L 29/66795; H01L 29/785; H01L 21/76224; H01L 21/823864
See application file for complete search history.

(56) References Cited

U.S. PATENT DOCUMENTS

| | | |
|---|---|---|
| 6,180,490 B1 | 1/2001 | Vassiliev et al. |
| 6,248,644 B1 | 6/2001 | Yang et al. |

(Continued)

FOREIGN PATENT DOCUMENTS

| | | |
|---|---|---|
| JP | 2008160125 A | 7/2007 |
| JP | 2007273794 A | 10/2007 |

(Continued)

*Primary Examiner* — Roy Potter
*Assistant Examiner* — Paul Patton
(74) *Attorney, Agent, or Firm* — Slater Matsil, LLP

(57) ABSTRACT

An embodiment is an integrated circuit structure including two insulation regions over a substrate with one of the two insulation regions including a void, at least a bottom surface of the void being defined by the one of the two insulation regions. The integrated circuit structure further includes a first semiconductor strip between and adjoining the two insulation regions, where the first semiconductor strip includes a top portion forming a fin over top surfaces of the two insulation regions, a gate dielectric over a top surface and sidewalls of the fin, and a gate electrode over the gate dielectric.

20 Claims, 12 Drawing Sheets

Related U.S. Application Data continuation of application No. 14/275,632, filed on May 12, 2014, now Pat. No. 9,112,052, which is a continuation-in-part of application No. 13/918,728, filed on Jun. 14, 2013, now Pat. No. 8,723,271, which is a division of application No. 12/612,442, filed on Nov. 4, 2009, now Pat. No. 8,519,481.

(60) Provisional application No. 61/251,587, filed on Oct. 14, 2009.

(51) Int. Cl.
*H01L 21/762* (2006.01)
*H01L 21/764* (2006.01)
*H01L 21/84* (2006.01)

(52) U.S. Cl.
CPC ...... *H01L 27/0886* (2013.01); *H01L 29/0649* (2013.01); *H01L 29/0653* (2013.01); *H01L 21/845* (2013.01)

(56) References Cited

U.S. PATENT DOCUMENTS

| | | |
|---|---|---|
| 6,706,571 B1 | 3/2004 | Yu et al. |
| 6,858,478 B2 | 2/2005 | Chau et al. |
| 6,949,768 B1 | 9/2005 | Anderson et al. |
| 7,129,541 B2 | 10/2006 | Kim et al. |
| 7,190,050 B2 | 3/2007 | King et al. |
| 7,247,887 B2 | 7/2007 | King et al. |
| 7,265,008 B2 | 9/2007 | King et al. |
| 7,508,031 B2 | 3/2009 | Liu et al. |
| 7,528,465 B2 | 5/2009 | King et al. |
| 7,605,449 B2 | 10/2009 | Liu et al. |
| 7,989,856 B2 | 8/2011 | Goto et al. |
| 8,519,481 B2 | 8/2013 | Yuan et al. |
| 8,723,271 B2 * | 5/2014 | Yuan ............ H01L 21/76224 257/386 |
| 2005/0153490 A1 | 7/2005 | Yoon et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2008/0111199 A1 | 5/2008 | Kim et al. |
| 2008/0277739 A1 | 11/2008 | Curatola |
| 2008/0290470 A1 | 11/2008 | King et al. |
| 2008/0296632 A1 | 12/2008 | Moroz et al. |
| 2008/0318392 A1 | 12/2008 | Hung et al. |
| 2009/0174040 A1 | 7/2009 | Gogoi et al. |
| 2009/0181477 A1 | 7/2009 | King et al. |
| 2011/0188288 A1 | 8/2011 | Minami |
| 2013/0277757 A1 | 10/2013 | Yuan et al. |
| 2014/0246731 A1 | 9/2014 | Chen et al. |

FOREIGN PATENT DOCUMENTS

| | | |
|---|---|---|
| JP | 2008147269 A | 6/2008 |
| JP | 2009147194 A | 7/2009 |
| KR | 1020060107406 A | 10/2006 |
| KR | 20070064346 A | 6/2007 |

* cited by examiner

VOIDS IN STI REGIONS FOR FORMING BULK FINFETS

PRIORITY CLAIM

This application is a continuation of U.S. patent application Ser. No. 14/826,977, filed Aug. 14, 2015, titled "Voids in STE Regions for Forming Bulk FinFETs," which will issue as U.S. Pat. No. 9,385,046, issue date Jul. 5, 2016, which is a continuation of U.S. patent application Ser. No. 14/275,632, filed on May 12, 2014, titled "Voids in STI Regions for Forming Bulk FinFETs," which is now U.S. Pat. No. 9,112,052, issued Aug. 18, 2015, which is a continuation in part of U.S. patent application Ser. No. 13/918,728, filed on Jun. 14, 2013, titled "Voids in STI Regions for Forming Bulk FinFETs," now U.S. Pat. No. 8,723,271, issued May 13, 2014, which is a divisional of U.S. patent application Ser. No. 12/612,442, filed Nov. 4, 2009, titled "Voids in STI Regions for Forming Bulk FinFETs," now U.S. Pat. No. 8,519,481, issued Aug. 27, 2013, which application further claims the benefit of U.S. Provisional Application No. 61/251,587, filed on Oct. 14, 2009, which applications are hereby incorporated herein by reference.

TECHNICAL FIELD

This application relates generally to integrated circuits and more particularly to structures and manufacturing methods of shallow trench isolation (STI) regions and semiconductor fins.

BACKGROUND

With the increasing down-scaling of integrated circuits and increasingly demanding requirements to the speed of integrated circuits, transistors need to have higher drive currents with increasingly smaller dimensions. Fin field-effect transistors (FinFET) were thus developed. FIG. 1 illustrate a cross-sectional view of a conventional FinFET, wherein the cross-sectional view is made crossing the fin rather than the source and drain regions. Fins 100 are formed as vertical silicon fins extending above substrate 102 and are used to form source and drain regions (not shown) and channel regions therebetween. Shallow trench isolation (STI) regions 120 are formed to define fins 100. Gate 108 is formed over fins 100. Gate dielectric 106 is formed to separate fins 100 from gate 108.

It is realized that the parasitic capacitance (shown with capacitors 110) is generated between gate 108 and semiconductor strips 122, wherein STI regions 120 act as the insulator of parasitic capacitor 110. The parasitic capacitance adversely affects the performance of the respective integrated circuit, and needs to be reduced.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

A novel method for forming a shallow trench isolation (STI) region and a fin field-effect transistor (FinFET) is provided. The intermediate stages in the manufacturing of an embodiment are illustrated, and variations of the embodiment are discussed. Throughout the various views and illustrative embodiments, like reference numbers are used to designate like elements.

Figure 1:
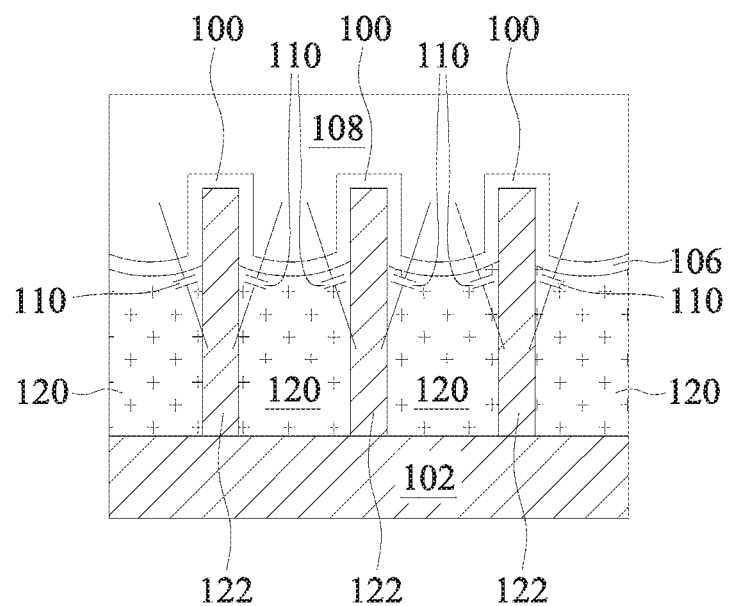
FIG. 1 illustrates a cross-sectional view of a conventional FinFET.
Figure 2:
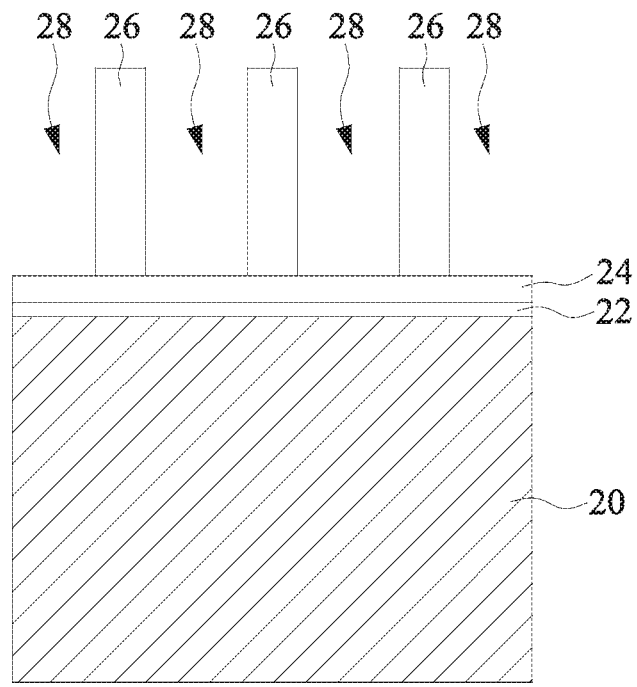
FIGS. 2 through 11 are cross-sectional views of intermediate stages in the manufacturing of a FinFET in accordance with various embodiments.

Referring to FIG. 2, semiconductor substrate 20 is provided. In an embodiment, semiconductor substrate 20 includes silicon. Other commonly used materials, such as carbon, germanium, gallium, arsenic, nitrogen, indium, and/or phosphorus, and the like, may also be included in semiconductor substrate 20. Semiconductor substrate 20 may be a bulk substrate or a semiconductor-on-insulator (SOI) substrate.

Pad layer 22 and mask layer 24 may be formed on semiconductor substrate 20. Pad layer 22 may be a thin film comprising silicon oxide formed, for example, using a thermal oxidation process. Pad layer 22 may act as an adhesion layer between semiconductor substrate 20 and mask layer 24. Pad layer 22 may also act as an etch stop layer for etching mask layer 24. In an embodiment, mask layer 24 is formed of silicon nitride, for example, using low-pressure chemical vapor deposition (LPCVD). In other embodiments, mask layer 24 is formed by thermal nitridation of silicon, plasma enhanced chemical vapor deposition (PECVD), or plasma anodic nitridation. Mask layer 24 is used as a hard mask during subsequent photolithography processes. Photo resist 26 is formed on mask layer 24 and is then patterned, forming openings 28 in photo resist 26.

Figure 3:
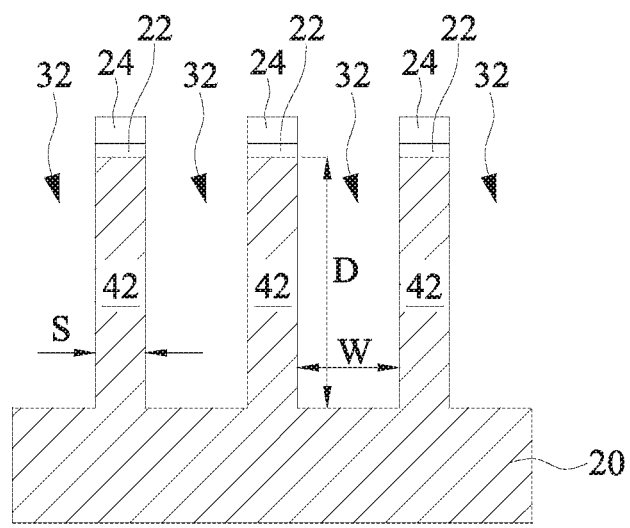

Referring to FIG. 3, mask layer 24 and pad layer 22 are etched through openings 28, exposing underlying semiconductor substrate 20. The exposed semiconductor substrate 20 is then etched, forming trenches 32. Portions of semiconductor substrate 20 between trenches 32 form semiconductor strips 42. Trenches 32 may be strips (in the top view) parallel to each other, and closely located relative each other. For example, the spacing S between trenches 32 may be smaller than about 30 nm. Photo resist 26 is then removed. Next, a cleaning may be performed to remove a native oxide of semiconductor substrate 20. The cleaning may be performed using diluted hydrofluoric (HF) acid.

Depth D of trenches 32 may be between about 2100 Å and about 2500 Å, while width W is between about 300 Å and about 1500 Å. In an exemplary embodiment, the aspect ratio (D/W) of trenches 32 is greater than about 7.0. In other exemplary embodiments, the aspect ratios may even be greater than about 8, although they may also be lower than about 7.0, or between 7.0 and 8.0. One skilled in the art will realize, however, that the dimensions and values recited throughout the descriptions are merely examples, and may be changed to suit different scales of integrated circuits.

Figure 4:
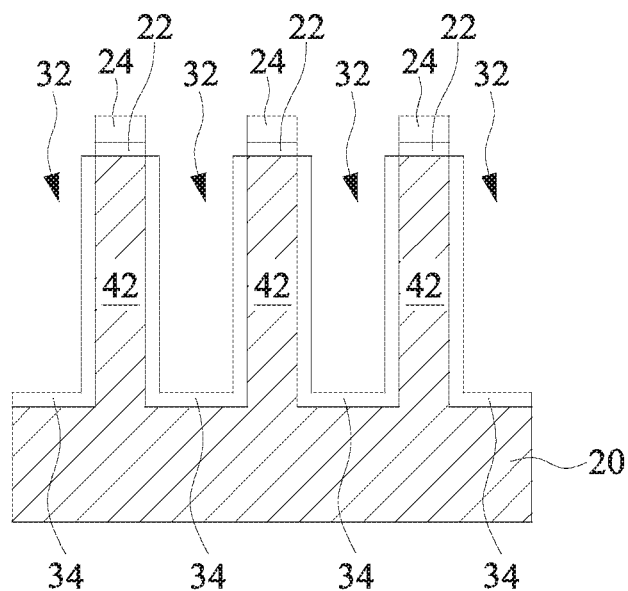

Liner oxide 34 is then formed in trenches 32, as is shown in FIG. 4. In an embodiment, liner oxide 34 may be a thermal oxide having a thickness between about 20 Å to about 500 Å. In other embodiments, liner oxide 34 may be formed using in-situ steam generation (ISSG). In yet other embodiments, liner oxide 34 may be formed using a deposition technique that can form conformal oxide layers, such as selective area chemical vapor deposition (SACVD) and the like. The formation of liner oxide 34 rounds the corners of trenches 32, which reduces the electrical fields, and hence improves the performance of the resulting integrated circuit.

Figure 5A:
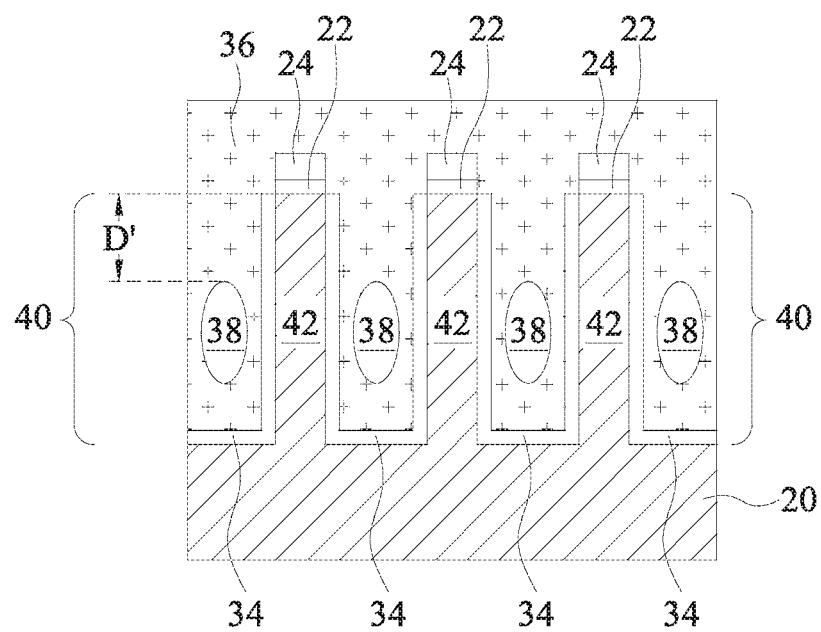
Figure 5B:
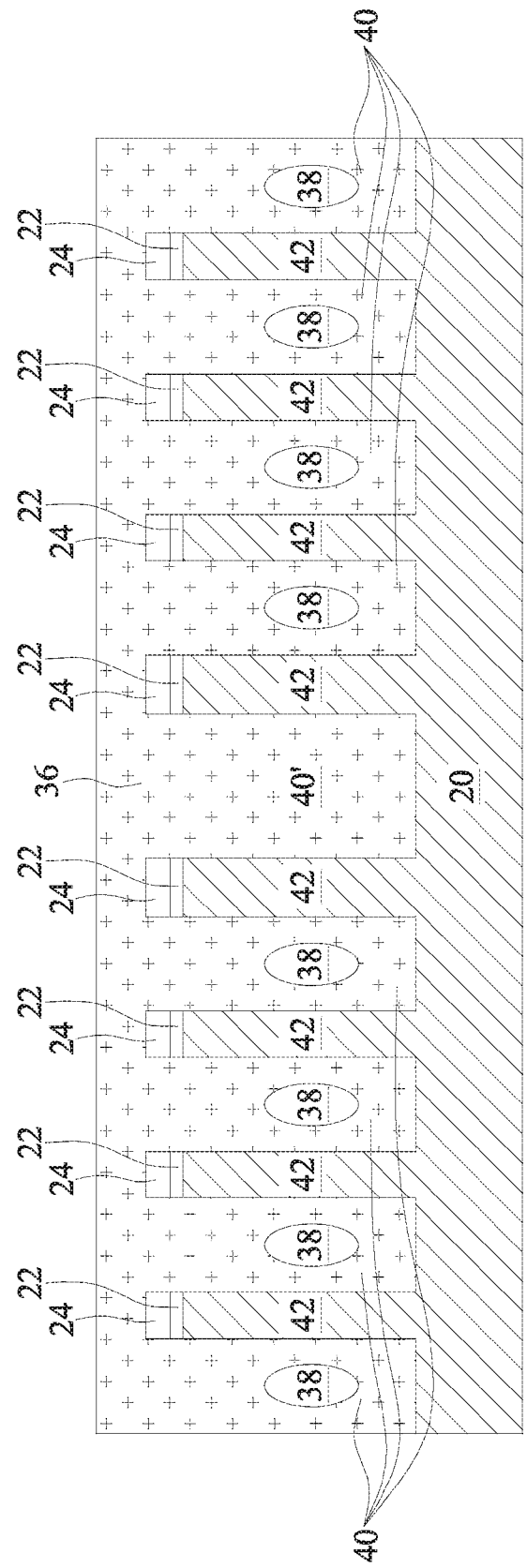
Figure 5C:
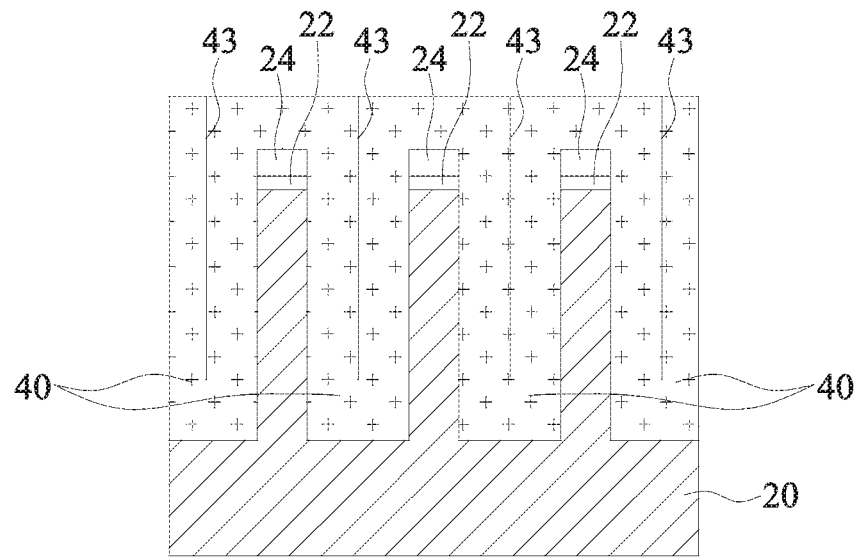

Referring to FIGS. 5A, 5B and 5C, trenches 32 are filled with dielectric material 36. Dielectric material 36 may include silicon oxide, and hence may be referred to as oxide 36 hereinafter, although other dielectric materials, such as SiN, SiC, or the like, may also be used. In an embodiment, oxide 36 is formed using a high aspect-ratio process (HARP) including process gases, such as tetraethylorthosilicate (TEOS), $O_3$ (ozone), the like, or a combination thereof. In another embodiment, the oxide 36 is formed using a spin-on process with materials such as, hydrogen silsesquioxane (HSQ), methyl silsesquioxane (MSQ), a polysilazane, the like, or a combination thereof. The portions of oxide 36 and liner oxide 34 in trenches 32 are referred to as shallow trench isolation (STI) regions 40 hereinafter. For simplicity, liner oxide 34 is not shown in FIGS. 5B, 5C and subsequent drawings.

Voids 38 may be formed in oxide 36. In an embodiment, voids 38 may be formed by selecting an appropriate method such as HARP that may help form voids in oxide 36 and adopting appropriate process conditions. Semiconductor strips 42 may be used to form a single FinFET (refer to FIGS. 10A and 11), although they can also be used to form multiple FinFETs. Accordingly, STI regions 40 between fins 42 are referred to as intra-device STI regions. Conversely, STI region 40' (FIGS. 5B and 11) between FinFETs is referred to as an inter-device STI region. In an embodiment, intra-device STI regions 40 have voids 38 formed therein, while inter-device STI region 40' does not have voids formed therein. Voids are more likely to be generated in trenches having greater aspect ratios. Further, inter-device STI region 40' may have a smaller aspect ratio than the aspect ratios of intra-device STI regions 40. Accordingly, the formation of voids 38 in intra-device STI regions 40 (but not in inter-device STI regions 40') may be achieved by selecting an appropriate method for forming oxide 36, and selecting appropriate aspect ratios for intra-device STI regions 40 and inter-device STI regions 40'.

Figure 7A:
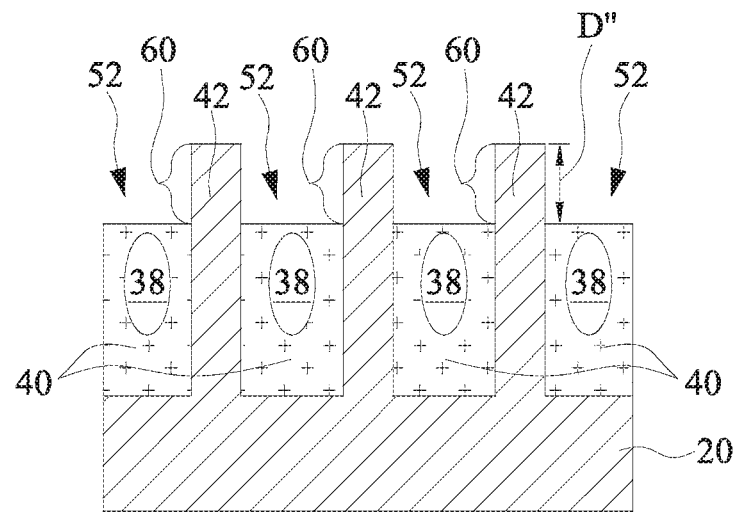
Figure 7B:
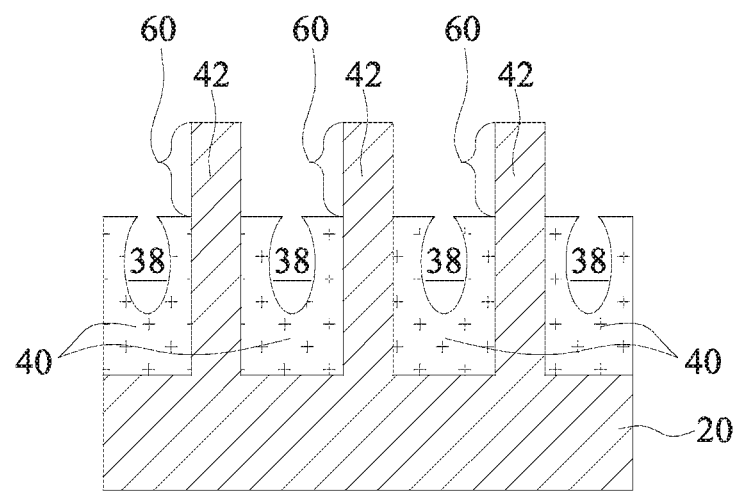
Figure 10A:
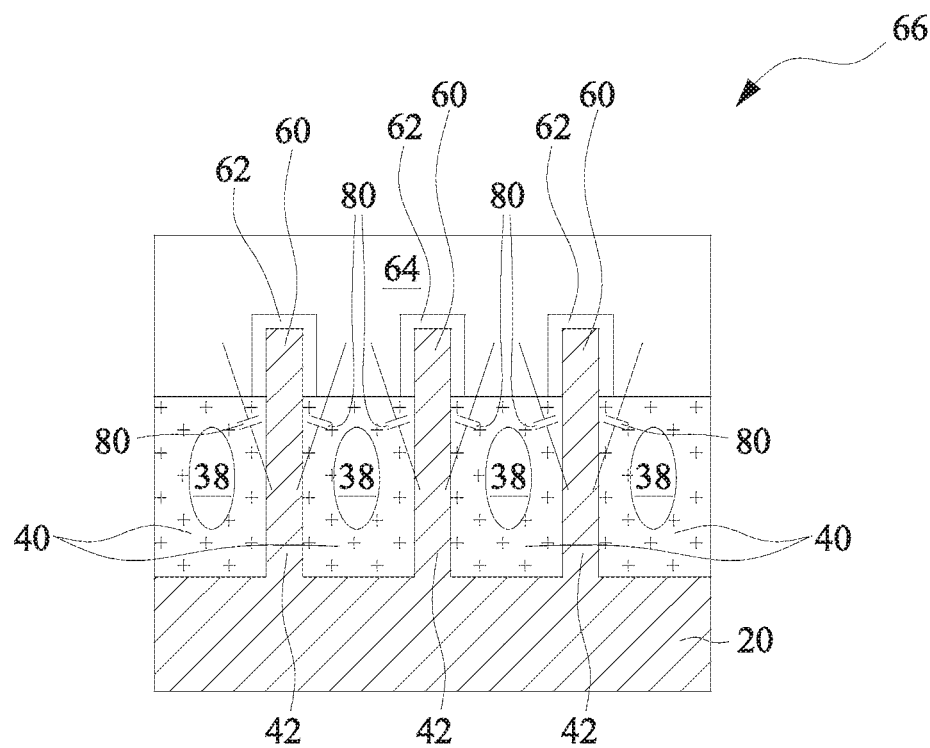
Figure 10B:
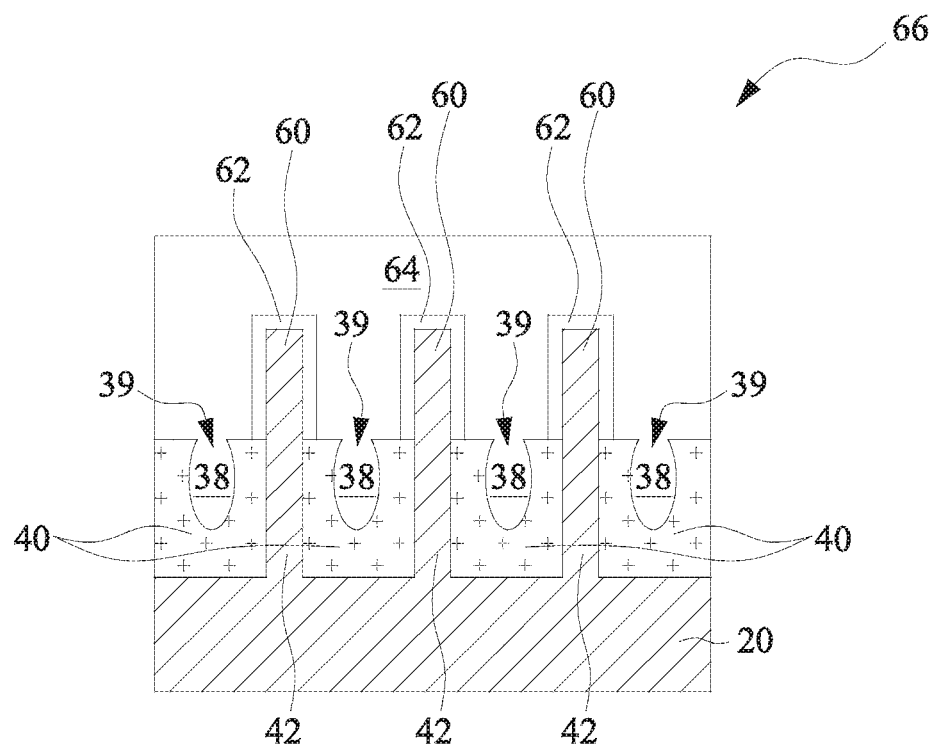
Figure 11:
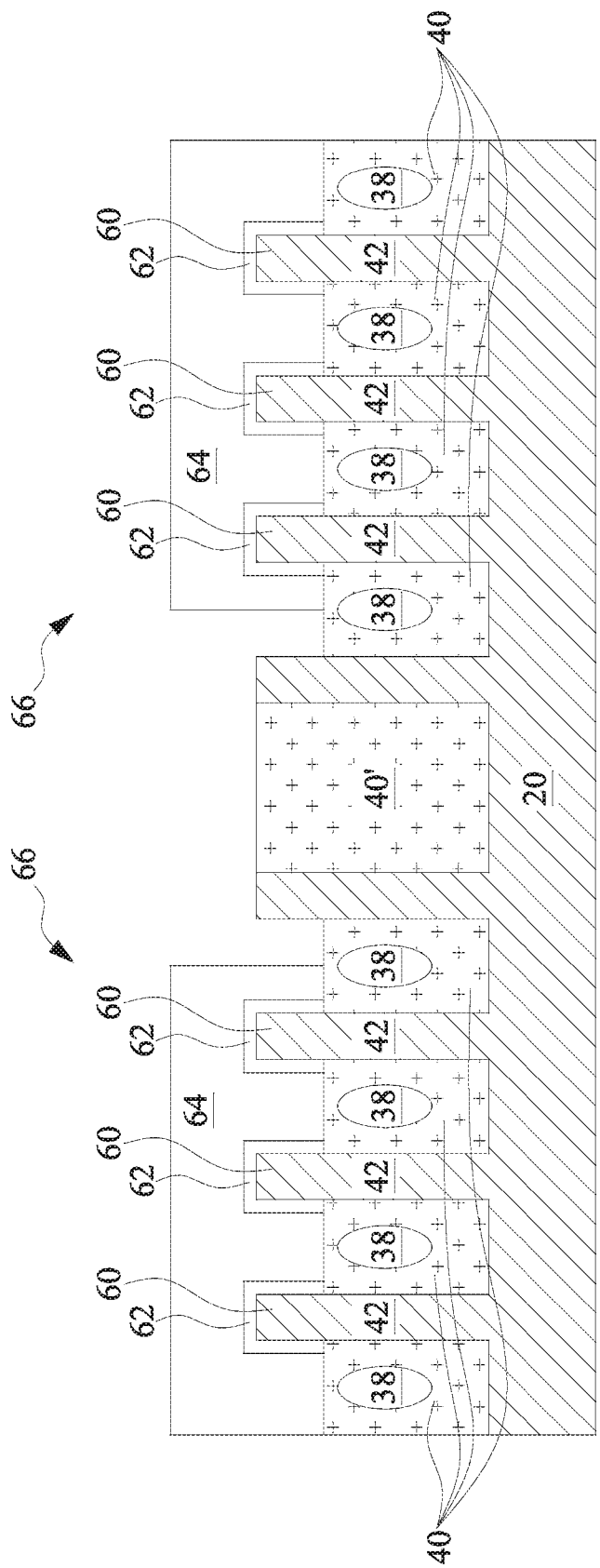

In addition, voids 38 are desirably left in the structure after the formation of the FinFET device (please refer to FIGS. 10A through 11). Accordingly, the desirable position of voids 38 are affected by the amount of STI regions to be removed in subsequent recessing steps (FIGS. 7A and 7B). In an embodiment, the top ends of voids 38 are vertically spaced apart from the top surfaces of fins 42 by distance D' (FIG. 5A) that is greater than about 25 nm. This may be achieved, for example, by adjusting the process conditions in the formation of oxide 36 such as the deposition rate, the flow rates of the process gases, the temperature of substrate 20, and the like. In an exemplary embodiment, STI regions 40 are formed with TEOS and ozone as process gases under a sub-atmospheric pressure, which may be greater than about 500 Torr. The pressure of the process gases in the forming chamber may also be between about 500 Torr and about 760 Torr. The flow rate of TEOS may be greater than about 10 sccm, while the flow rate of ozone may be greater than about 10 sccm. The high gate flow rate and high gas pressure facilitates the formation of voids.

In alternative embodiments, as shown in FIG. 5C, no voids 38 are formed. However, portions of oxide 36 grown on opposite sidewalls of trenches 32 join each other to form seam 43 at the center of trenches 32. Seams 43 are weak portions of oxide 36 due to the high density of dangling bonds.

Figure 6:
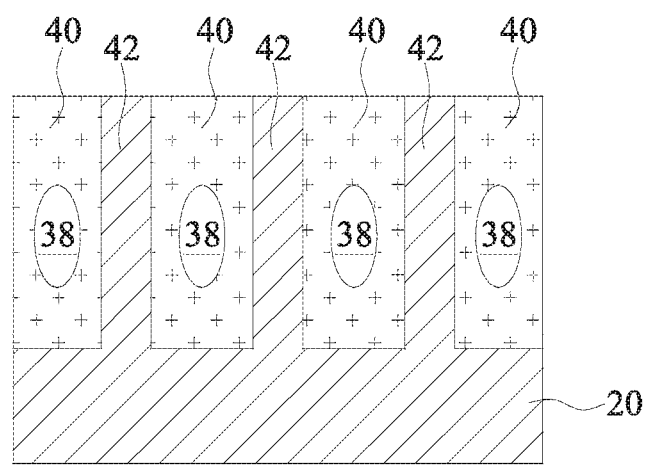

A chemical mechanical polish is then performed, followed by the removal of mask layer 24 and pad layer 22. The resulting structure is shown in FIG. 6. Mask layer 24, if formed of silicon nitride, may be removed by a wet process using hot $H_3PO_4$, while pad layer 22 may be removed using diluted HF acid if formed of silicon oxide.

Next, the structure shown in FIG. 6 may be used to form fins, which are further used for forming a FinFET. As shown in FIGS. 7A and 7B, STI regions 40 are recessed by etching, resulting in recesses 52. The portions of semiconductor strips 42 protruding over the top surfaces of the remaining STI regions 40 thus become fins 60. In an embodiment, the recessing of oxide 36 includes a wet dip, for example, in a diluted hydrofluoric (HF) acid solution. In alternative embodiment, the etching is a dry etching. Depth D" of recess 52 may be between 15 nm and about 50 nm.

Referring to FIG. 7A, voids 38 are embedded in, and enclosed by, the remaining portions of STI regions 40. In FIG. 7B, voids 38 may be exposed to external environment. However, the openings of voids 38 are small. In the embodiment shown in FIG. 5B, since seams 43 (FIG. 5C) are weak portions of STI regions 40, during the recessing of STI regions 40 seams 43 may be etched faster than other portions, so that voids 38 are formed. Further, if voids 38 were already formed before the recessing of STI regions 40, the exposed voids may be expanded.

Figure 8:
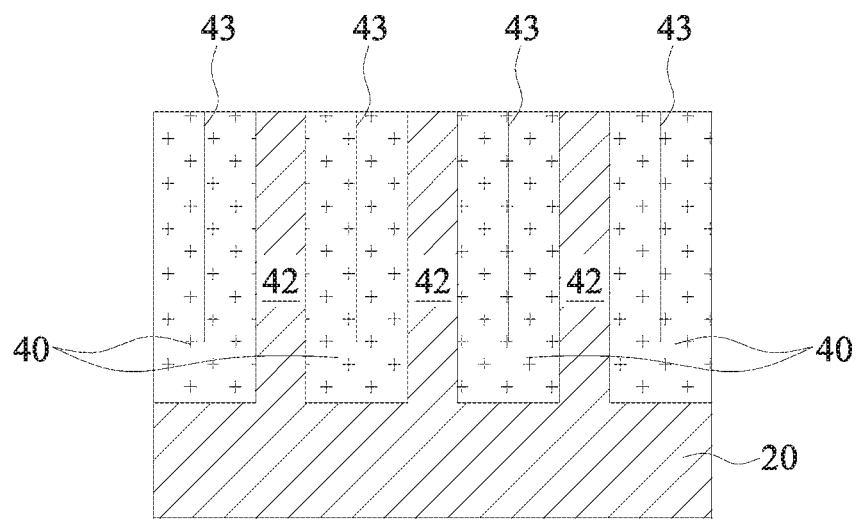

Referring to FIGS. 8, 9A, 9B, 9C, 9D, 9E, and 9F the shape and size of the voids 38 may be controlled by employing a two-step recess process for the STI regions 40. FIG. 8 illustrates the embodiment in FIG. 5C including the seams 43 after the STI regions 40 have been planarized and the mask layer 24 and pad layer 22 have been removed. In an embodiment, the top surfaces of the semiconductor strips 42 and the STI regions 40 are substantially coplanar.

Figure 9A:
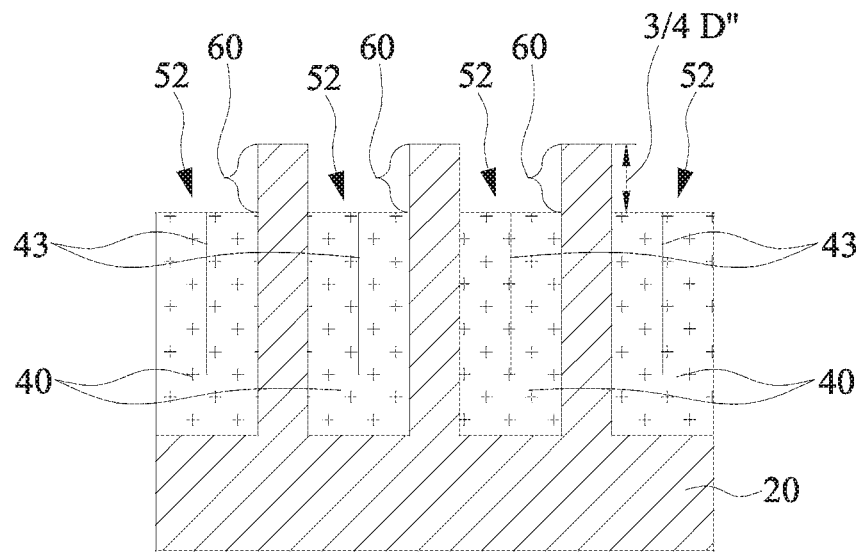
Figure 9B:
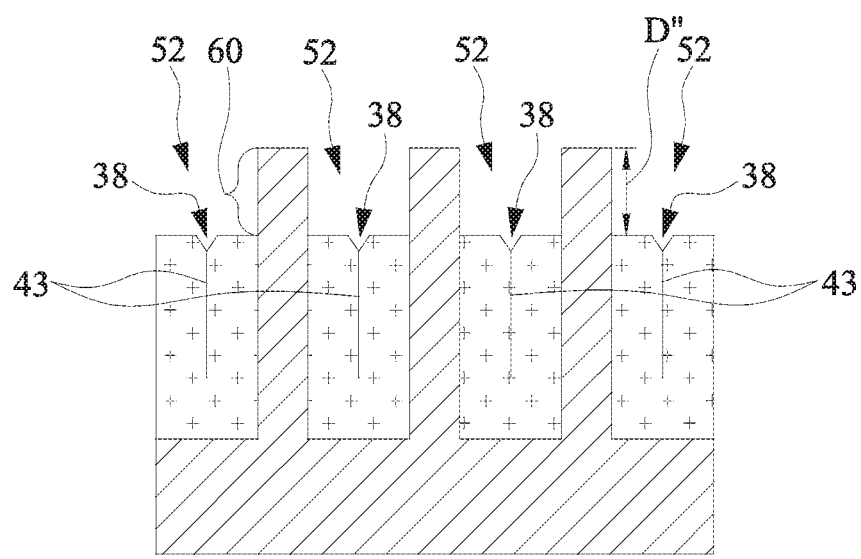

Referring to FIGS. 9A and 9B, the voids 38 are formed to have substantially inverted triangular shapes. In FIG. 9A, a first recess step of the STI regions 40 recess process (hereinafter "first recess step") is performed to form recesses 52 to a depth of about ¾ D". The first recess step may be a dry etch process, such as a selective dry etch process. In an embodiment, the dry etch process is a physical dry etching, a chemical dry etching, a reactive ion etching, the like, or a combination thereof. As discussed above, the depth D" is the depth of the recesses 52 after the STI regions 40 have been completely recessed. Hence, in this embodiment, the first recess step is controlled such that the STI regions 40 are recessed to about ¾ of the depth D" and the remaining portion of the depth D" (about ¼ D") will be recessed in a second step of the STI regions 40 recess process (hereinafter "second recess step) (see FIG. 9B).

In FIG. 9B, the second recess step is performed. The second recess step may be a wet etch process, such as a selective wet etch process. In an embodiment, the second recess step includes a wet dip in a diluted HF acid solution or the like. The second recess step recesses the STI regions 40 to a depth D" and also forms voids 38 in the STI regions 40. In the embodiment of FIG. 9B, the voids 38 in the STI regions 40 have substantially inverted triangular shapes with a vertex of the substantially triangular shapes being at or near the seams 43. A bottom surface of the void 38 forms two sides of a substantially triangular shape with the opening of the void 38 forming a third side of the substantially triangular shape. In this embodiment, the voids 38 are exposed through the top surfaces of STI regions 40.

Figure 9C:
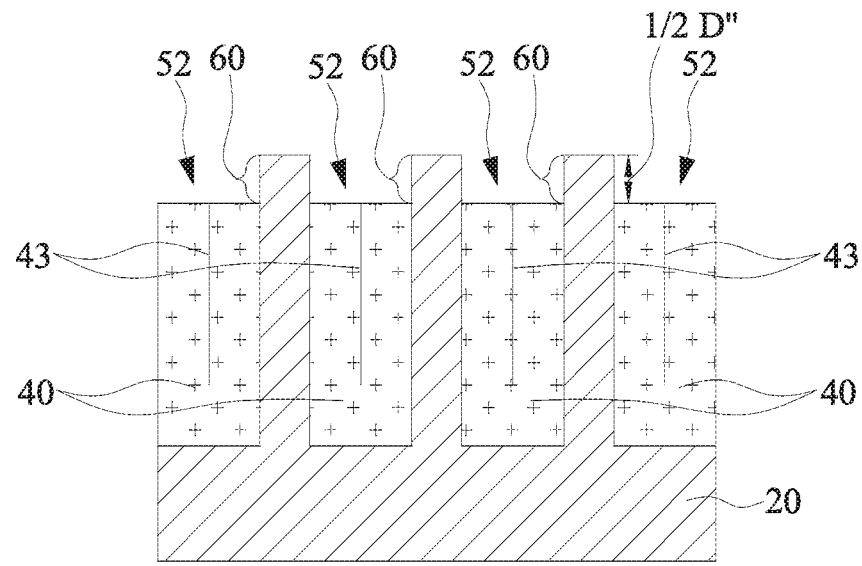
Figure 9D:
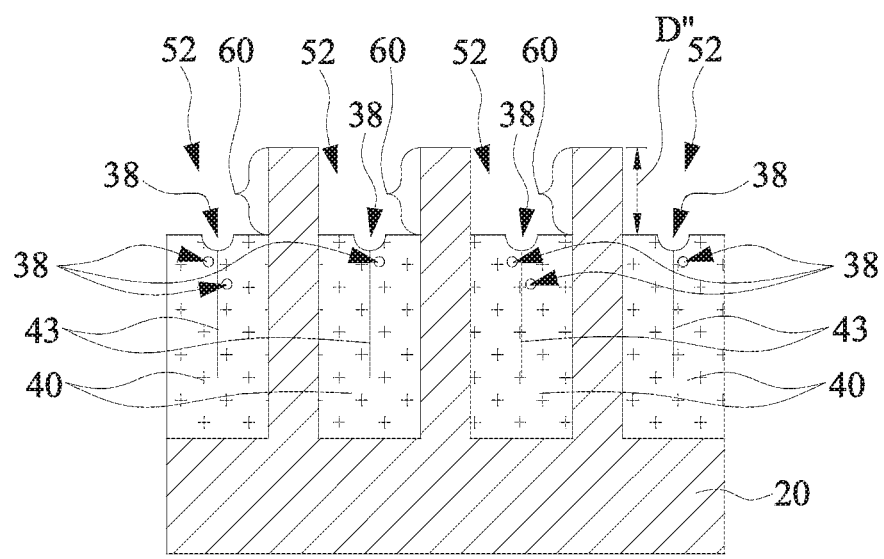

Referring to FIGS. 9C and 9D, the voids 38 are formed to have substantially circular shapes. In FIG. 9C, the first recess step of the STI regions 40 recess process is performed to form recesses 52 to a depth of about ½ D". The first recess step may be a dry etch process, such as a selective dry etch process. In an embodiment, the dry etch process is a physical dry etching, a chemical dry etching, a reactive ion etching, the like, or a combination thereof. As discussed above, the depth D" is the depth of the recesses 52 after the STI regions 40 have been completely recessed. Hence, in this embodiment, the first recess step is controlled such that the STI regions 40 are recessed to about ½ of the depth D" and the remaining portion of the depth D" (about ½ D") will be recessed in the second step of the STI regions 40 recess process (see FIG. 9D).

In FIG. 9D, the second recess step is performed. The second recess step may be a wet etch process, such as a selective wet etch process. In an embodiment, the second recess step includes a wet dip in a diluted HF acid solution or the like. The second recess step recesses the STI regions 40 to a depth D" and also forms voids 38 in the STI regions 40. In the embodiment of FIG. 9D, the voids 38 in the STI regions 40 have substantially circular shapes at or near the seams 43. In this embodiment, the voids 38 are exposed through the top surfaces of STI regions 40. In some embodiments, each of the STI regions 40 may include more than one void 38. In these embodiments, the STI regions 40 may include defects or weak points due to a filling process such as, a spin-on process, and the second recess step enlarges the weak points in the STI regions 40 to form the smaller voids 38.

Figure 9E:
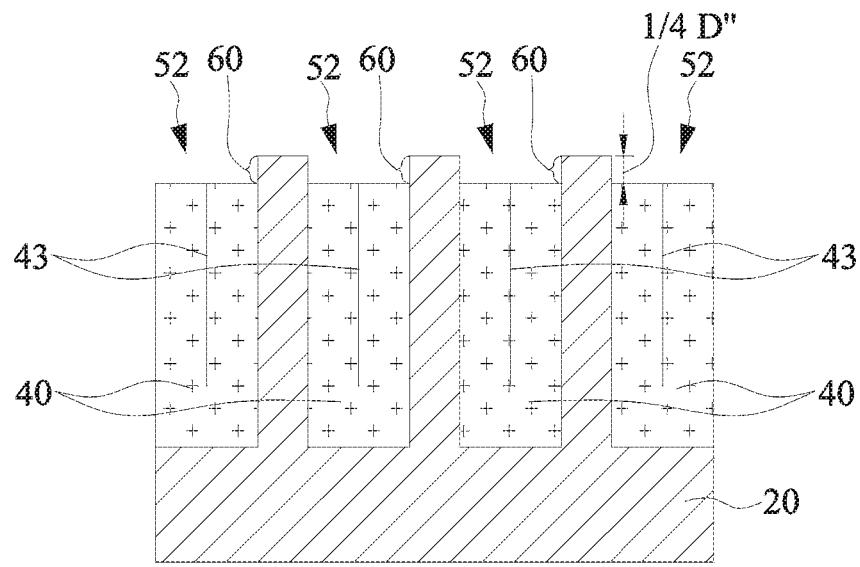
Figure 9F:
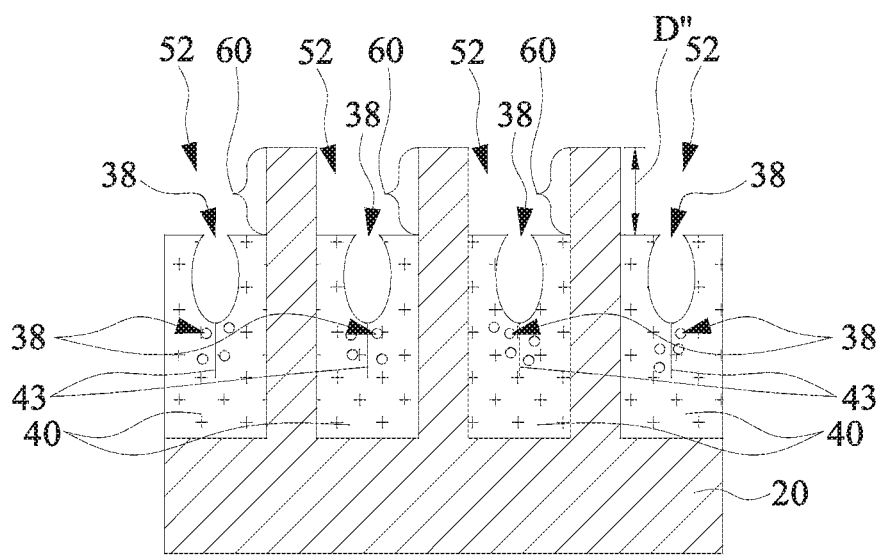

Referring to FIGS. 9E and 9F, the voids 38 are formed to have substantially elliptical shapes. In FIG. 9E, the first recess step of the STI regions 40 recess process is performed to form recesses 52 to a depth of about ¼ D". The first recess step may be a dry etch process, such as a selective dry etch process. In an embodiment, the dry etch process is a physical dry etching, a chemical dry etching, a reactive ion etching, the like, or a combination thereof. As discussed above, the depth D" is the depth of the recesses 52 after the STI regions 40 have been completely recessed. Hence, in this embodiment, the first recess step is controlled such that the STI regions 40 are recessed to about ¼ of the depth D" and the remaining portion of the depth D" (about ¾ D") will be recessed in the second step of the STI regions 40 recess process (see FIG. 9F).

In FIG. 9F, the second recess step is performed. The second recess step may be a wet etch process, such as a selective wet etch process. In an embodiment, the second recess step includes a wet dip in a diluted HF acid solution or the like. The second recess step recesses the STI regions 40 to a depth D" and also forms voids 38 in the STI regions 40. In the embodiment of FIG. 9F, the voids 38 in the STI regions 40 have substantially elliptical shapes at or near the seams 43. In this embodiment, the voids 38 are exposed through the top surfaces of STI regions 40. In some embodiments, each of the STI regions 40 may include more than one void 38. In these embodiments, the STI regions 40 may include defects or weak points due to a filling process such as, a spin-on process, and the second recess step enlarges the weak points in the STI regions 40 to form the smaller voids 38.

The location of the voids 38 in FIGS. 9B, 9D, and 9F are examples and are not intended to be limiting, as multiple voids 38 in a single STI region 40 may be scattered throughout STI regions 40.

The various shapes of the voids 38 in the FIGS. 9B, 9D, and 9F may be controlled by varying the process parameters of the second recess step of the two-step recess process for the STI regions 40. The variable process parameters include the amount of time the etch process is performed, the temperature at which the etch process is performed, and the concentration of the etchants (e.g. HF acid solution) used in the etch process. For example, in the second recess step of FIG. 9D, at least one of the process parameters (time, temperature, and etchant concentration) is greater than the corresponding process parameters used in the second recess step of FIG. 9B. Similarly, in the second recess step of FIG. 9F, at least one of the process parameters (time, temperature, and etchant concentration) is greater than the corresponding process parameters used in the second recess steps of FIG. 9D. In addition, the process parameters of first recess steps in the embodiments of FIGS. 9A, 9C, and 9E may also be changed to vary the depths of recesses 52 (e.g. ¾ D", ½ D", and ¼ D") to enable the depth D" after the second recess step to be substantially the same for each of the embodiments.

Referring to FIG. 10A, gate dielectric 62 is formed to cover the top surface and sidewalls of fins 60. Gate dielectric 62 may be formed by a thermal oxidation, and hence may include a thermal silicon oxide. In this embodiment, gate dielectric 62 is formed on the top surfaces of fins 60, but not on the top surfaces of STI regions 40. Alternatively, gate dielectric 62 may be formed by a deposition step. Accordingly, gate dielectric 62 is formed on the top surfaces of fins 60 and the top surfaces of STI regions 40. Gate electrode 64 is then formed on gate dielectric 62. In an embodiment, as shown in FIGS. 10A and 10B, gate electrode 64 covers more than one fin 60, so that the resulting FinFET 66 is a multi-fin FinFET. In alternative embodiments, each of fins 60 may be used to form one FinFET. The remaining components of FinFET 66, including source and drain regions and source and drain silicides (not shown) are then formed. The formation processes of these components are known in the art, and hence are not repeated herein.

FIG. 10B illustrates another embodiment formed from the structure shown in FIG. 7B. Although voids 38 are exposed through the top surfaces of STI regions 40, openings 39 are small enough such that after the formation of gate electrode 64, openings 39 of voids 38 are sealed by gate electrode 64, and voids 38 are not filled.

It is appreciated that although in the embodiments as shown in FIGS. 5A through 7B 9B, and 10A through 11, only one void 38 is shown in each of STI regions 40, the number of voids in each of STI regions 40 may be greater than one, and the multiple voids in a single STI region 40 may be scattered throughout STI regions 40.

FIG. 11 illustrates both an inter-device STI region 40' and intra-device STI regions 40, which structure is formed from the structure shown in FIG. 5C. It is noted that inter-device STI region 40', which does not have any gate electrode directly above it, does not comprise any void. As a comparison, intra-device STI regions 40, which may be directly under gate electrodes 64, may comprise voids 38.

The embodiments have several advantageous features. Voids are formed in the STI regions underlying gate electrodes of FinFETs. Since voids are air pockets that have a k value equal to 1, the effective k value of the entire STI regions 40 is reduced. The capacitance of parasitic capacitors 80 (FIG. 10A) is reduced. The performance of the resulting integrated circuits is thus improved.

An embodiment is an integrated circuit structure including two insulation regions over a substrate with one of the two insulation regions including a void, at least a bottom surface of the void being defined by the one of the two insulation regions. The integrated circuit structure further includes a first semiconductor strip between and adjoining the two insulation regions, where the first semiconductor strip includes a top portion forming a fin over top surfaces of the two insulation regions, a gate dielectric over a top surface and sidewalls of the fin, and a gate electrode over the gate dielectric.

Another embodiment is an integrated circuit structure including a first semiconductor strip over a semiconductor substrate, a second semiconductor strip over the semiconductor substrate, a first shallow-trench isolation (STI) region over the substrate and between and adjoining the first semiconductor strip and the second semiconductor strip, where the first STI region includes a plurality of voids therein, and where a portion of the first semiconductor strip over a top surface of the first STI region forms a first fin, and a portion of the second semiconductor strip over the top surface of the first STI region forms a second fin. The integrated circuit structure further includes a gate dielectric over top surfaces and sidewalls of the first fin and the second fin, and a gate electrode over the gate dielectric.

A further embodiment is a method of forming an integrated circuit structure, the method including forming two insulation regions in a semiconductor substrate, with a strip of the semiconductor substrate between and adjoining the two insulation regions, and etching top surfaces of the two insulation regions with a first etch process, to a first depth below a top surface of the strip of semiconductor substrate. The method further includes etching the top surfaces of the two insulation regions with a second etch process to a second depth below the top surface of the strip of semiconductor substrate, the second depth being greater than the first depth, where a top portion of the strip of the semiconductor substrate over the top surfaces of the two insulation regions forms a first fin, and where after the second etch process, one of the two insulation regions comprises a void therein.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a first insulation region and a second insulation region in a semiconductor substrate, with a first semiconductor strip of the semiconductor substrate between and adjoining the first and second insulation regions, the first insulation region comprising a void; and
    recessing a top surface of the first insulation region to be below a top surface of the first semiconductor strip, wherein after the step of recessing, a top surface of the second insulation region being level with the top surface of the first semiconductor strip.

2. The method of claim 1 further comprising:
    forming a second semiconductor strip adjacent the first semiconductor strip, wherein after recessing the top surface of the first insulation region, an upper portion of the second semiconductor strip extends above the top surface of the first insulation region forming a first fin;
    forming a gate dielectric on a top surface and sidewalls of the first fin; and
    forming a gate electrode on the gate dielectric.

3. The method of claim 1, wherein the second insulation region is free from voids.

4. The method of claim 1, wherein the second insulation region is not under any gate electrode.

5. The method of claim 2, wherein the gate electrode comprises a portion directly over the void.

6. The method of claim 2, wherein the void is exposed to the gate electrode.

7. The method of claim 1, wherein the void has a top end lower than a top surface of the first insulation region.

8. A structure comprising:
    a first semiconductor strip and a second semiconductor strip extending from a substrate;
    a first insulation region over the substrate and adjoining the first semiconductor strip, the first insulation region comprising a void therein;
    a second insulation region over the substrate and adjoining the second semiconductor strip, the second insulation region comprising a void therein, top surfaces of the first semiconductor strip and the second semiconductor strip being over top surfaces of the first insulation region and the second insulation region; and
    a third insulation region over the substrate and between and adjoining the first semiconductor strip and the second semiconductor strip, the third insulation region being between the first insulation region and the second insulation region, a top surface of the third insulation region being higher than top surfaces of the first insulation region and the second insulation region.

9. The structure of claim 8, wherein the top surface of the third insulation region is level with the top surfaces of the first semiconductor strip and the second semiconductor strip.

10. The structure of claim 8, wherein the third insulation region is free from voids.

11. The structure of claim 8, wherein the third insulation region is not under any gate electrode.

12. The structure of claim 8 further comprising:
    a first semiconductor fin adjacent the first semiconductor strip and the first insulation region, a top surface of the first semiconductor fin being over the top surface of the first insulation region;
    a gate dielectric on the top surface and sidewalls of the first semiconductor fin; and
    a gate electrode on the gate dielectric.

13. The structure of claim 12, wherein the gate electrode comprises a portion directly over the void in the first insulation region.

14. The structure of claim 12, wherein the void of the first insulation region is exposed to the gate electrode.

15. The structure of claim 12, wherein the void of the first insulation region has a top end lower than a top surface of the first insulation region.

16. A method comprising:

forming a first semiconductor strip and a second semiconductor strip over a substrate;

etching the substrate to form a first trench; and filling the first trench with a dielectric material to form a first insulation region, the first insulation region being between and adjoining the first semiconductor strip and the second semiconductor strip; and recessing the first insulation region below top surfaces of the first semiconductor strip and the second semiconductor strip, wherein the recessing the first insulation region forms a void in the first insulation region, wherein after the recessing the first insulation region a portion of the first semiconductor strip is over a top surface of the first insulation region forming a first fin, and a portion of the second semiconductor strip is over the top surface of the first insulation region forming a second fin.

17. The method of claim 16 further comprising:

forming a gate dielectric over top surfaces and sidewalls of the first fin and the second fin; and forming a gate electrode over the gate dielectric.

18. The method of claim 16, wherein the void has a top end lower than a top surface of the first insulation region.

19. The method of claim 16, wherein recessing the first insulation region comprises:

etching a top surface of the first insulation region with a first etch process to a first depth below the top surfaces of the first semiconductor strip and the second semiconductor strip; and etching the top surface of the first insulation region with a second etch process to a second depth below the top surfaces of the first semiconductor strip and the second semiconductor strip, the second depth being greater than the first depth.

20. The method of claim 19, wherein after the second etch process, a bottom surface of the void forms two sides of a substantially triangular shape, a substantially circular shape, or substantially elliptical shape.

\* \* \* \* \*